US012813306B2

(12) United States Patent
Jeong et al.

(10) Patent No.: US 12,813,306 B2
(45) Date of Patent: Nov. 24, 2026

(54) CIRCUIT BOARD

(71) Applicant: SAMSUNG ELECTRO-MECHANICS CO., LTD., Suwon-si (KR)

(72) Inventors: Chi Hyeon Jeong, Suwon-si (KR); Seong Hwan Lee, Suwon-si (KR); Hyun Sang Kwak, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 452 days.

(21) Appl. No.: 18/240,685

(22) Filed: Aug. 31, 2023

(65) Prior Publication Data

US 2024/0379513 A1 Nov. 14, 2024

(30) Foreign Application Priority Data

May 10, 2023 (KR) ........................ 10-2023-0060636

(51) Int. Cl.
*H10W 70/685* (2026.01)
*H10W 70/05* (2026.01)
*H10W 70/692* (2026.01)
*H10W 72/20* (2026.01)
(Continued)

(52) U.S. Cl.
CPC ......... *H10W 70/685* (2026.01); *H10W 70/05* (2026.01); *H10W 70/095* (2026.01); *H10W 70/692* (2026.01); *H10W 72/252* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

2009/0290317 A1* 11/2009 Mashino .............. H05K 1/0231 29/832
2010/0224396 A1* 9/2010 Nomiya .................. B32B 18/00 156/89.12
2015/0027757 A1 1/2015 Shin et al.
(Continued)

FOREIGN PATENT DOCUMENTS

CN 103458629 A * 12/2013
JP 2003179354 A * 6/2003
(Continued)

OTHER PUBLICATIONS

English translation of CN 103458629 A (Year: 2013).*
(Continued)

*Primary Examiner* — Khaja Ahmad
(74) *Attorney, Agent, or Firm* — Morgan, Lewis & Bockius LLP

(57) ABSTRACT

A circuit board includes a first glass layer, a first wiring layer and a second wiring layer embedded in upper and lower portions of the first glass layer, respectively, a first via layer penetrating through the first glass layer and connected to the first and second wiring layers, a second glass layer disposed on an upper surface of the first glass layer, a third wiring layer embedded in an upper portion of the second glass layer, and a second via layer penetrating through the second glass layer and connected to the first and third wiring layers.

15 Claims, 14 Drawing Sheets

(51) Int. Cl.
*H10W 74/15* (2026.01)
*H10W 90/00* (2026.01)

(56) References Cited

U.S. PATENT DOCUMENTS

| | | | | |
|---|---|---|---|---|
| 2016/0079149 A1* | 3/2016 | Yoshida | H05K 3/241 174/257 |
| 2016/0128186 A1* | 5/2016 | Cho | H05K 1/0271 29/846 |
| 2016/0343650 A1* | 11/2016 | Ma | H05K 1/0306 |

FOREIGN PATENT DOCUMENTS

| | | | |
|---|---|---|---|
| KR | 10-2012-0095420 | A | 8/2012 |
| KR | 10-2015-0014167 | A | 2/2015 |
| WO | 2011/084216 | A2 | 7/2011 |

OTHER PUBLICATIONS

English translation of JP 2003179354 A (Year: 2003).*
SKC "Now Fighting for Packaging" . . . The world's first 'high-performance semiconductor glass substrate,' production base (https://www.joongang.co.kr/article/25134326#home), Jan. 17, 2023, pp. 1-6 and English translation.
Z. Wu et al., "3D Integrated High-Precision Passives on Thin Glass Substrates for Miniaturized and High-Performance RF Components," Journal of Microelectronics and Electronic Packaging, 2018, vol. 15, pp. 107-116.

* cited by examiner

CIRCUIT BOARD

CROSS-REFERENCE TO RELATED APPLICATION(S)

This application claims benefit of priority to Korean Patent Application No. 10-2023-0060636 filed on May 10, 2023 in the Korean Intellectual Property Office, the disclosure of which is incorporated herein by reference in its entirety.

TECHNICAL FIELD

The present disclosure relates to a circuit board.

Package technology continues to develop, and in detail, attempts to use glass materials by breaking away from the use of organic materials and traditional substrate manufacturing methods are continuing. On the other hand, a traditional package has low cost and high reliability due to being a mature technology, but due to the nature of the organic material, it may be difficult to lower the flatness thereof, and thus there is a limit to miniaturization of the traces. Conversely, when glass materials are used, traces may be miniaturized due to low flatness, but since copper (Cu) does not adhere sufficiently during patterning, copper may be detached during the cleaning process, and in addition, there is a limit to applying the glass material to a multilayer structure rather than a monolayer structure.

SUMMARY

An aspect of the present disclosure is to provide a circuit board including a multilayer glass layer on which the wiring layer is formed, in which occurrence of a problem in adhesion of a wiring layer may be prevented even when a glass material is used.

An aspect of the present disclosure is to implement a multilayer circuit board by forming a pattern groove and a through-hole in respective glass layers and then filling the same with a plating material to form a embedded pattern, and by bonding the plurality of glass layers vertically.

According to an aspect of the present disclosure, a circuit board includes a first glass layer; a first wiring layer and a second wiring layer embedded in upper and lower portions of the first glass layer, respectively; a first via layer penetrating through the first glass layer and connected to the first and second wiring layers; a second glass layer disposed on an upper surface of the first glass layer; a third wiring layer embedded in an upper portion of the second glass layer; and a second via layer penetrating through the second glass layer and connected to the first and third wiring layers.

According to an aspect of the present disclosure, a circuit board includes a first glass layer having a first pattern groove and a second pattern groove disposed in upper and lower surfaces, respectively, and a first through-hole disposed between the first and second pattern grooves and connecting the first and second pattern grooves; a first metal layer disposed in the first and second pattern grooves and the first through-hole; a second glass layer disposed on an upper surface of the first glass layer, and having a third pattern groove in an upper surface and a second through-hole disposed below the third pattern groove; and a second metal layer disposed in the third pattern groove and the second through-hole.

According to an aspect of the present disclosure, a circuit board includes a plurality of glass layers bonded to each other, each glass layer having a wiring layer embedded therein; and vias embedded in one or more of the plurality of glass layers to connect to respective wiring layers in the plurality of glass layers to each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
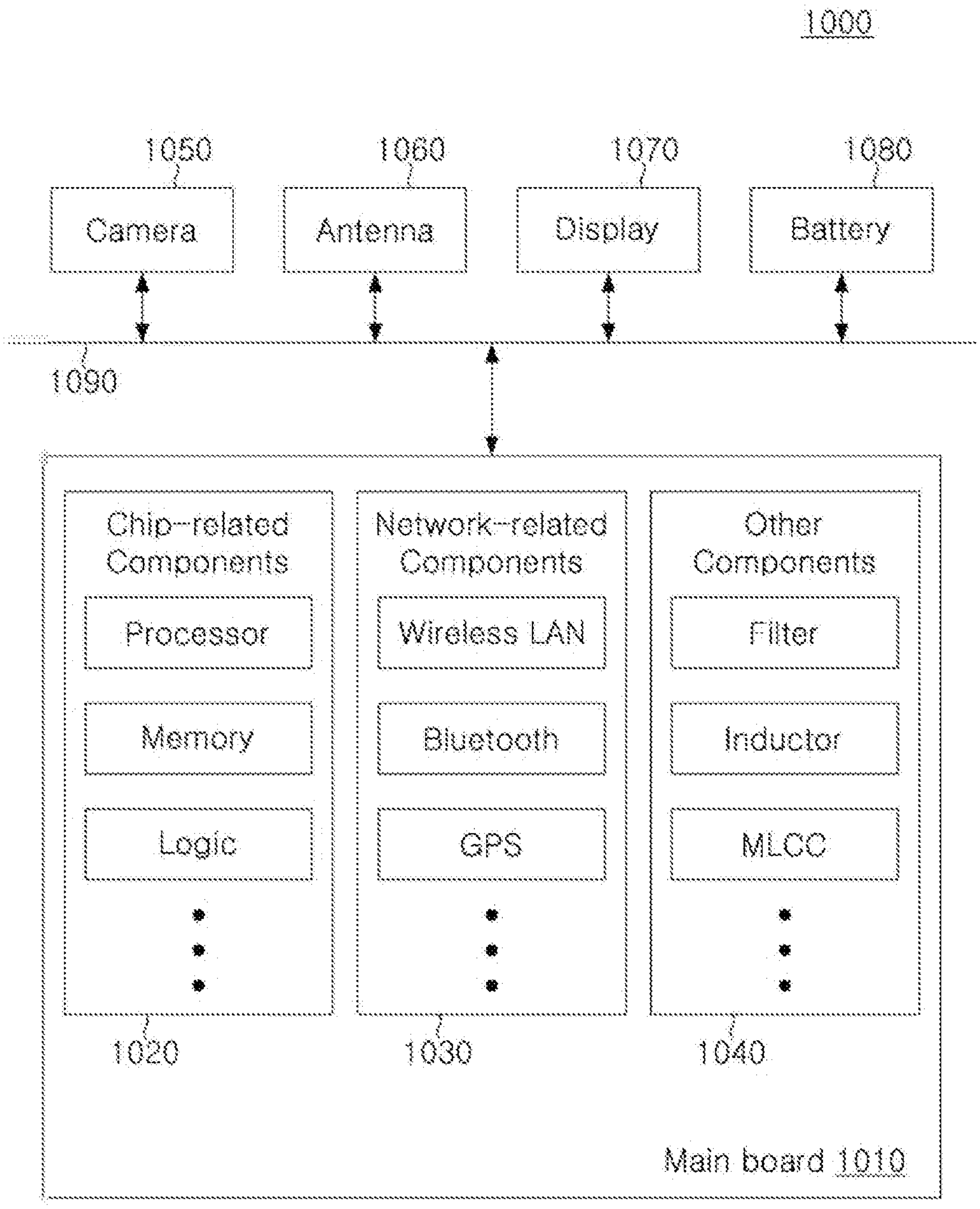
FIG. 1 is a block diagram schematically illustrating an example of an electronic device system.

Hereinafter, the present disclosure will be described with reference to the accompanying drawings. The shapes and sizes of elements in the drawings may be exaggerated or reduced for clearer description.

Electronic Device

FIG. 1 is a block diagram schematically illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related electronic components. In addition, the chip related components 1020 may also be combined with each other. The chip-related component 1020 may be in the form of a package including the aforementioned chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive elements in the form of chip components used for various other purposes, and the like. In addition, other components 1040 may also be combined with the chip related components 1020 and/or the network related components 1030.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like, but are not limited thereto. These other electronic components may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, these other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
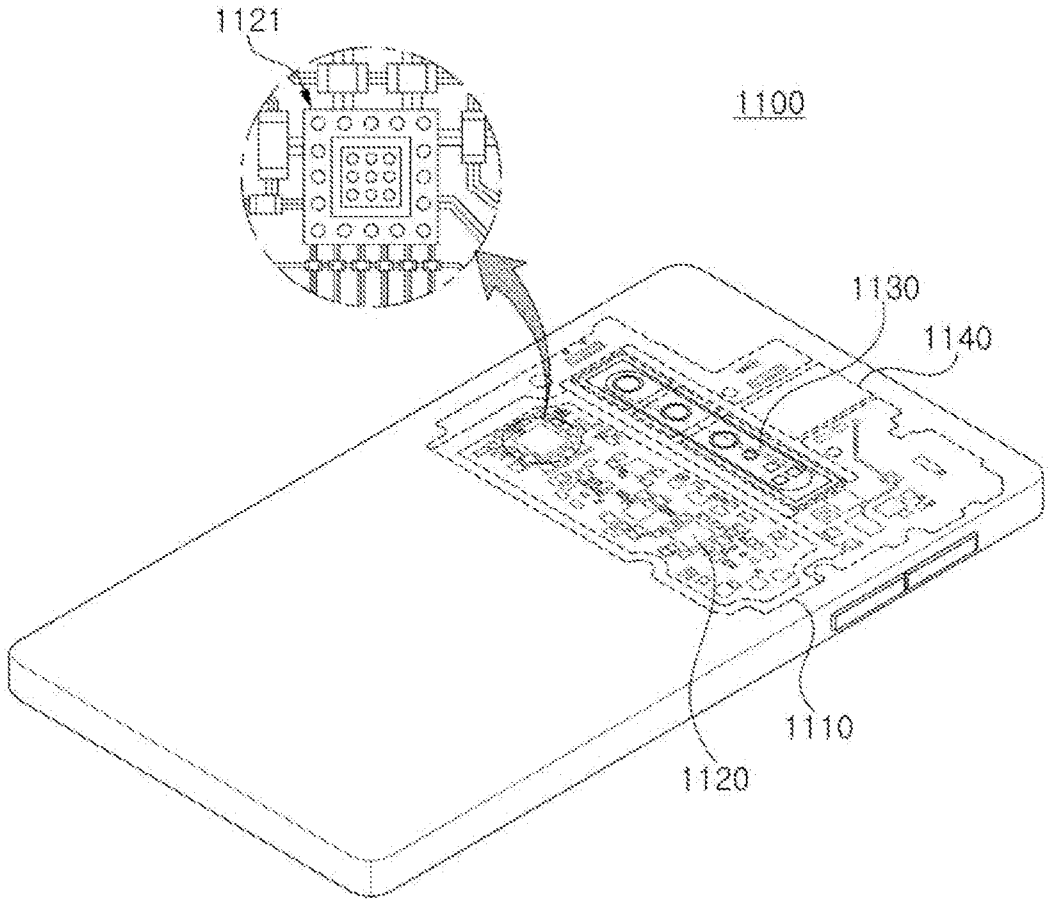
FIG. 2 is a perspective view schematically illustrating an example of an electronic device.

FIG. 2 is a schematic perspective view illustrating an example of an electronic device.

Referring to the drawings, the electronic device may be, for example, a smartphone 1100. A motherboard 1110 is accommodated inside the smartphone 1100, and various portions 1120 are physically and/or electrically connected to the motherboard 1110. In addition, other components that may or may not be physically and/or electrically connected to the motherboard 1110, such as a camera module 1130 and/or a speaker 1140, are accommodated therein. Some of the components 1120 may be the aforementioned chip-related components, for example, a component package 1121, but the present disclosure is not limited thereto. The component package 1121 may be in the form of a circuit board on which electronic components including active components and/or passive components are surface mounted. Alternatively, the component package 1121 may be in the form of a circuit board in which active components and/or passive components are embedded. On the other hand, the electronic device is not necessarily limited to the smartphone 1100, and may also be other electronic devices as described above.

Circuit Board

Figure 3:
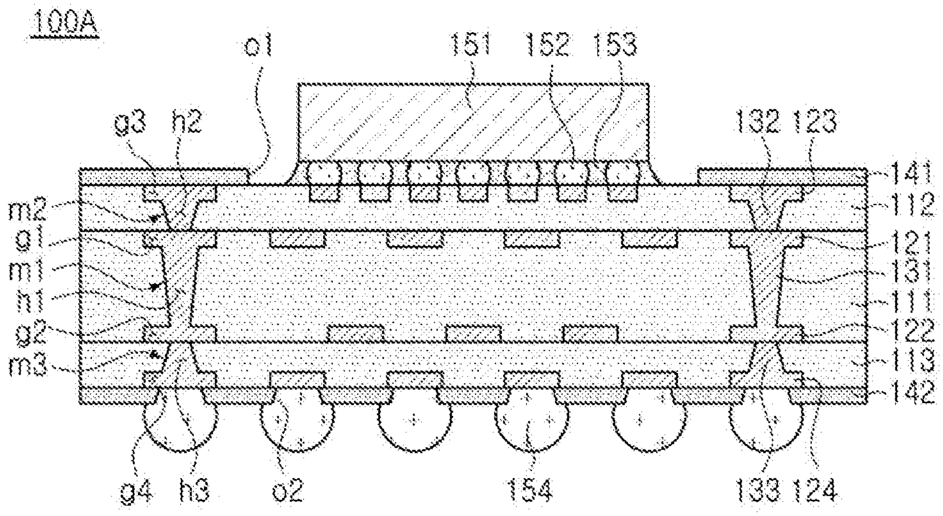
FIG. 3 is a schematic cross-sectional view of an example of a circuit board.

FIG. 3 is a cross-sectional view schematically illustrating an example of a circuit board.

Referring to the drawings, a circuit board 100A according to an example may include a first glass layer 111, first and second wiring layers 121 and 122 embedded in the upper and lower portions of the first glass layer 111, respectively, a first via layer 131 penetrating the first glass layer 111 and connected to the first and second wiring layers 121 and 122, a second glass layer 112 disposed on the upper surface of the first glass layer 111, a third wiring layer 123 embedded in the upper portion of the second glass layer 112, a second via layer 132 penetrating the second glass layer 112 and connected to the first and third wiring layers 121 and 123, a third glass layer 113 disposed on the lower surface of the first glass layer 111, a fourth wiring layer 124 embedded in a lower portion of the third glass layer 113, and/or a third via layer 133 penetrating the third glass layer 113 and connected to the second and fourth wiring layers 122 and 124.

If necessary, the circuit board 100A may further include a first resist layer 141 disposed on the upper surface of the second glass layer 112 and having a first opening o1 exposing at least a portion of the third wiring layer 123, a second resist layer 142 disposed on the lower surface of the third glass layer 113 and having a second opening o2 exposing at least a portion of the fourth wiring layer 124, a semiconductor chip 151 disposed on the first opening o1 and connected to exposed at least a portion of the third wiring layer 123 through a connecting member 152, an underfill 153 fixing the lower portion of the semiconductor chip 151 in the first opening o1, and/or an electrical connection metal 154 disposed on the second opening o2 of the second resist layer 141 and connected to exposed at least a portion of the fourth wiring layer 124.

The first and second pattern grooves g1 and g2 may be formed in the upper and lower surfaces of the first glass layer 111, respectively. A first through-hole h1 connecting the first and second pattern grooves g1 and g2 may be formed between the first and second pattern grooves g1 and g2. The first and second pattern grooves g1 and g2 and the first through-hole h1 may be filled with a first metal layer m1. A third pattern groove g3 may be formed in the upper surface of the second glass layer 112, and a second through-hole h2 may be formed below the third pattern groove g3. The third pattern groove g3 and the second through-hole h2 may be filled with a second metal layer m2. A fourth pattern groove g4 may be formed in the lower surface of the third glass layer 113, and a third through-hole h3 may be formed below the fourth pattern groove g4. The fourth pattern groove g4 and the third through-hole h3 may be filled with a third metal layer m3. The first to third metal layers m1, m2, and m3 may be separate layers separated from each other.

The upper surface of the first glass layer 111 may directly contact the lower surface of the second glass layer 112, and the lower surface of the first glass layer 111 may directly contact the upper surface of the third glass layer 113. For example, silicon dioxide ($SiO_2$) of the first and second glass layers 111 and 112 and silicon dioxide ($SiO_2$) of the first and third glass layers 111 and 113 may be directly bonded, respectively. Also, the first wiring layer 121 may directly contact the second via layer 132, and the second wiring layer 122 may directly contact the third via layer 133. For example, copper (Cu) of the first wiring layer 121 and copper (Cu) of the second via layer 132 may be directly bonded, and copper (Cu) of the second wiring layer 122 and copper (Cu) of the third via layer 133 may be directly bonded. For example, a first metal layer m1 and a second metal layer m2 may be directly bonded, and the first metal layer m1 and a third metal layer m3 may be directly bonded. For example, the first to third glass layers 111, 112 and 113 in which the first to fourth wiring layers 121, 122, 123 and 124 and the first to third via layers 131, 132 and 133 are formed may be bonded vertically by a copper (Cu)-silicon dioxide ($SiO_2$) hybrid bonding.

In this manner, in the circuit board 100A according to an example, the first to fourth pattern grooves g1, g2, g3 and g4 and the first to third through-holes h1, h2 and h3 are formed in the first to third glass layers 111, 112 and 113, and may then be filled with the first to third metal layers m1, m2 and m3. As a result, the first to fourth wiring layers 121, 122, 123, and 124 and the first to third via layers 131, 132, and 133 may be formed in the form of an embedded pattern in the first to third glass layers 111, 112, and 113. Accordingly, an issue in which the first to fourth wiring layers 121, 122, 123, and 124 do not come into close contact with the first to third glass layers 111, 112, and 113 due to flatness may be resolved. In addition, by having a structure in which the first to third glass layers 111, 112, and 113 are bonded vertically, a multilayered circuit board may be implemented without a separate deposition process. In addition, since the circuit board 100A is a multilayer board including a glass material, dielectric loss, loss due to surface roughness and the like may be reduced, and it may be more advantageous for fine patterning, as compared to multilayer substrates using an organic material of the related art. In addition, the device size may be further reduced due to the high permittivity.

Hereinafter, the components of the circuit board 100A according to an example will be described in more detail with reference to the drawings.

The first to third glass layers 111, 112, and 113 may respectively include glass that is an amorphous solid. The glass may include, for example, pure silicon dioxide (about 100% $SiO_2$), soda lime glass, borosilicate glass, alumino-silicate glass, and the like, but the present disclosure is not limited thereto. For example, as alternative glass materials, fluorine glass, phosphoric acid glass, chalcogen glass and the like may also be used as materials. In addition, other additives may be further included to form a glass having specific physical properties. These additives include magnesium, calcium, manganese, aluminum, lead, boron, iron, chromium, potassium, sulfur and antimony, and carbonates and/or oxides of these elements and other elements, as well as calcium carbonate (e.g., lime) and sodium carbonate (e.g., soda).

The first to third glass layers 111, 112, and 113 may be a layer distinct from organic insulating materials including glass fiber, glass cloth, glass fabric, and the like, for example, Copper Clad Laminate (CCL) and Prepreg (PPG). For example, each of the first to third glass layers 111, 112, and 113 may include plate glass. The first glass layer 111 may be a core layer, and the second and third glass layers 112 and 113 may be build-up layers, and accordingly, the first glass layer 111 may be thicker than each of the second and third glass layers 112 and 113.

The first to fourth pattern grooves g1, g2, g3, and g4 may respectively penetrate through a portion of any one of the first to third glass layers 111, 112, and 113 in the thickness direction from the upper or lower surface of any one of the first to third glass layers 111, 112, and 113. For example, the first pattern groove g1 may pass through a portion of the first glass layer 111 in the thickness direction from the upper surface of the first glass layer 111, the second pattern groove g2 may pass through a portion of the first glass layer 111 from the lower surface of the first glass layer 111 in the thickness direction, the third pattern groove g3 may pass through a portion of the second glass layer 112 in the thickness direction from the upper surface of the second glass layer 112, and the fourth pattern groove g4 may pass through a portion of the third glass layer 113 from the lower surface of the third glass layer 113 in the thickness direction. The first to fourth pattern grooves g1, g2, g3, and g4 may be respectively variously formed in a line (or trace) shape, a plane (or plate) shape, and a pad (or land) shape, and the like. The first to fourth pattern grooves g1, g2, g3, and g4 may respectively have one or more grooves, in detail, a plurality of grooves. Each of the first to fourth pattern grooves g1, g2, g3, and g4 may have a quadrangular cross section, but is not limited thereto, and may also be formed to have a circular or oval cross sectional shape.

The first to third through-holes h1, h2, and h3 may pass through the first to third glass layers 111, 112, and 113 in the thickness direction, respectively. For example, the first through-hole h1 may pass through the first glass layer 111 and be connected to the first and second pattern grooves g1 and g2, and the second through-hole h2 may pass through the second glass layer 112 and be connected to the first and third pattern grooves g1 and g3. The third through-hole h3 may pass through the third glass layer 113 and be connected to the second and fourth pattern grooves g2 and g4. Each of the first to third through-holes h1, h2, and h3 may have one or more holes, in detail, a plurality of holes. Each of the first to third through-holes h1, h2, and h3 may have a tapered cross section, but is not limited thereto, and may be formed in other shapes such as an elliptical shape, an hourglass shape or the like. As a non-limiting example, the first through-hole h1 and the second through-hole h2 may have a tapered shape in the same direction, and the third through-hole h3 may have a tapered shape in the opposite direction to the first and second through-holes h1 and h2.

The first to third metal layers m1, m2, and m3 may respectively fill the first to fourth pattern grooves g1, g2, g3, and g4 and the first to third through-holes h1, h2, and h3. For example, the first metal layer m1 may fill the first and second pattern grooves g1 and g2 and the first through-hole h1, the second metal layer m2 may fill the third pattern groove g3 and the second through-hole h2, and the third metal layer m3 may fill the fourth pattern groove g4 and the third through-hole h3. The first to third metal layers m1, m2, and m3 may include copper (Cu), aluminum (Al), silver (Ag), tin (Sn), gold (Au), nickel (Ni), lead (Pb), titanium (Ti), and/or alloys thereof, and the like, and in detail, include copper (Cu), but the present disclosure is not limited thereto. The first to third metal layers m1, m2, and m3 may be distinct layers having a boundary with each other. Each of the first to third metal layers m1, m2, and m3 may further include a seed metal layer. The seed metal layer of each of the first to third metal layers m1, m2, and m3 may be disposed with a relatively thin thickness on the respective wall and bottom surfaces of the first to fourth pattern grooves g1, g2, g3 and g4 and the first to third through-holes h1, h2 and h3.

Each of the first to fourth wiring layers 121, 122, 123, and 124 may include a metal. Examples of the metal include copper (Cu), aluminum (Al), silver (Ag), tin (Sn), gold (Au), nickel (Ni), lead (Pb), titanium (Ti), and/or alloys thereof, and in detail, may include copper (Cu), but the present disclosure is not limited thereto. The first to fourth wiring layers 121, 122, 123, and 124 may respectively perform various functions according to design, and for example, may include a signal pattern, a power pattern, a ground pattern, and the like. These patterns may respectively have various shapes, such as lines (or traces), planes (or plates), pads (or lands), and the like. The first to fourth wiring layers 121, 122, 123, and 124 may include an electroless plating layer (or chemical copper) and an electrolytic plating layer (or electrolytic copper). A sputtering layer may be included instead of the electroless plating layer (or chemical copper), or both may be included.

The upper and lower surfaces of the first glass layer 111 may be substantially coplanar with the upper and lower surfaces of the first wiring layer 121 and the lower surface of the second wiring layer 122, respectively. An upper surface of the second glass layer 112 may be substantially coplanar with an upper surface of the third wiring layer 123. The lower surface of the third glass layer 113 may be substantially coplanar with the lower surface of the fourth wiring layer 124. For example, the first to fourth wiring layers 121, 122, 123, and 124 may be substantially embedded in the first to third glass layers 111, 112, and 113 in the form of an embedded trace substrate (ETS). Therefore, the adhesion issue due to flatness may be easily resolved, the formation of microcircuit is more facilitated, and reduction in the overall thickness of the substrate may be facilitated.

The first to third via layers 131, 132, and 133 may respectively include a metal. Examples of the metal include copper (Cu), aluminum (Al), silver (Ag), tin (Sn), gold (Au), nickel (Ni), lead (Pb), titanium (Ti), and/or alloys thereof, and in detail, may include copper (Cu), but the present disclosure is not limited thereto. Each of the first to third via layers 131, 132, and 133 may perform various functions according to design, and for example, may include ground vias, power vias, signal vias, and the like. Each of the first to third via layers 131, 132, and 133 may have a tapered cross section, but is not limited thereto, and may be formed in other shapes such as an elliptical shape or an hourglass shape. The first to third via layers 131, 132, and 133 may respectively include an electroless plating layer (or chemical copper) and an electrolytic plating layer (or electrolytic copper). A sputtering layer may be included instead of the electroless plating layer (or chemical copper), or both may be included.

The first via layer 131 may include the same first metal layer m1 as the metal layers of the first and second wiring layers 121 and 122, and accordingly, the first via layer 131 may be integrated with respective at least portions of the first and second wiring layers 121 and 122 without a boundary. The second via layer 132 may include the same second metal layer m2 as the third wiring layer 123, and accordingly, the second via layer 132 may be integrated with at least a portion of the third wiring layer 123 without a boundary. The third via layer 133 may include the same third metal layer m3 as the fourth wiring layer 124, and accordingly, the third via layer 133 may be integrated with at least a portion of the fourth wiring layer 124 without a boundary.

The first and second resist layers 141 and 142 may respectively include a liquid or film type solder resist, but are not limited thereto, and may also include other types of insulating materials. A surface treatment layer may be formed on the pattern exposed through the first opening o1 and/or the second opening o2, if necessary. In addition, a metal bump may be formed on the pattern exposed through the first opening o1 and/or the second opening o2.

The semiconductor chip 151 may include an integrated circuit (IC) die in which hundreds to millions of devices or more are integrated into a single chip. In this case, the integrated circuit may be a logic chip such as, for example, a central processor (e.g., CPU), a graphics processor (e.g., GPU), a field programmable gate array (FPGA), a digital signal processor, a cryptographic processor, a microprocessor, a microcontroller, an application processor (e.g., AP), an analog-to-digital converter, an application-specific IC (ASIC), or the like, but is not limited thereto, and may also be a memory chip such as a volatile memory (e.g., DRAM), a non-volatile memory (e.g., ROM), a flash memory, a high bandwidth memory (HBM), or other types such as Power Management ICs (PMICs). The number of semiconductor chips 151 may be plural, which, in this case, may be the same as or different from each other.

The semiconductor chip 151 may be formed based on an active wafer, and in this case, silicon (Si), germanium (Ge), gallium arsenide (GaAs), or the like may be used as a base material constituting the body. Various circuits may be formed in the body. A connection pad may be formed on the body, and the connection pad may include a conductive material such as aluminum (Al) or copper (Cu). The semiconductor chip 151 may be a bare die, and in this case, metal bumps may be disposed on connection pads. The semiconductor chip 151 may be a packaged die, and in this case, an additional redistribution layer is formed on the connection pad, and metal bumps may be disposed on the redistribution layer.

The connecting member 152 may be formed of a low melting point metal, for example, solder such as tin (Sn)-aluminum (Al)-copper (Cu) or the like, which is only an example and the material is not particularly limited thereto. The connecting member 152 may be a ball or the like. The connecting member 152 may be formed of a multilayer or a single layer, and may include copper pillars and solder when formed as a multilayer. When formed as a single layer, the connecting member 152 may include tin-silver solder or copper, but the present disclosure is not limited thereto. The connecting member 152 may be plural, and the number thereof is not particularly limited.

The underfill 153 may include an insulating material, for example, an epoxy insulating material, but is not limited thereto. The underfill 153 may be disposed between the upper surface of the second glass layer 112 and the lower surface of the semiconductor chip 151, and may cover the connecting member 152.

The electrical connection metal 154 may connect the circuit board 100A to a main board or other substrate of an electronic device, or the like. The electrical connection metal 154 may be formed of a conductive material, for example, solder or the like, but this is only an example and the material is not particularly limited thereto. The electrical connection metal 154 may be a ball, pin, or the like. The electrical connection metal 154 may be formed as a multilayer or a single layer. When formed as a multilayer, the electrical connection metal 154 may include copper pillars and solder, and when formed as a single layer, the electrical connection metal 154 may include tin-silver solder or copper, but the present disclosure is not limited thereto. The number of electrical connection metals 154 may be plural, and the number thereof is not particularly limited.

FIGS. 4A to 4H are process diagrams schematically illustrating an example of manufacturing the circuit board of FIG. 3.

Figure 4A:
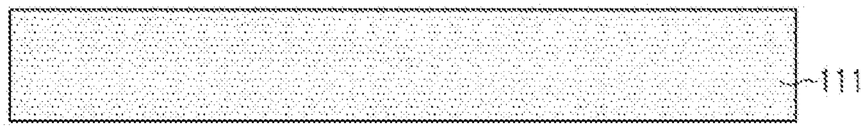
FIGS. 4A to 4H are process diagrams schematically illustrating an example of manufacturing the circuit board of FIG. 3.

Referring to FIG. 4A, a first glass layer 111 is prepared. The first glass layer 111 may be in the form of plate glass.

Figure 4B:
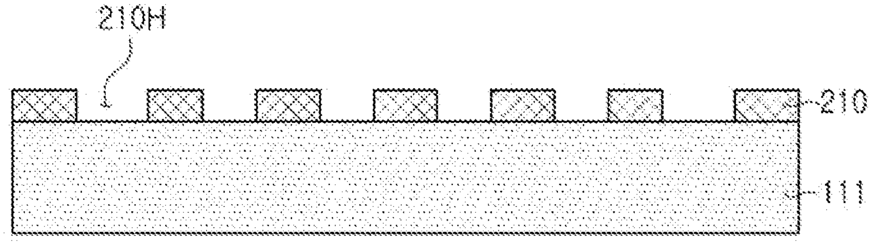

Referring to FIG. 4B, a mask 210 having a groove 210H is attached to the upper surface of the first glass layer 111. The groove 210H may have a shape penetrating through the mask 210 in a thickness direction, and may be plural. Each groove 210H may have various shapes such as a line (or trace), a plane (or plate), a pad (or land) and the like.

Figure 4C:
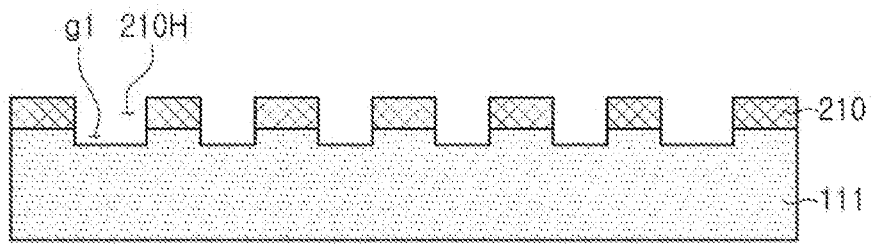

Referring to FIG. 4C, a first pattern groove g1 is formed in the upper surface of the first glass layer 111. For example, the upper surface of the first glass layer 111 exposed through the groove 210H of the mask 210 may be etched to form the first pattern groove g1.

A second pattern groove g2 may be formed in the lower surface of the first glass layer 111 through substantially the same process as the process described with reference to FIGS. 4B and 4C.

Figure 4D:
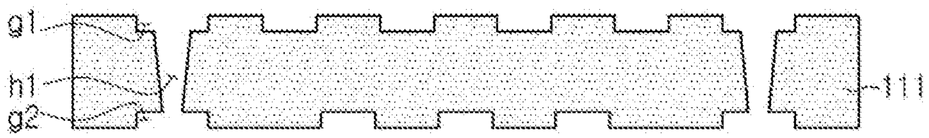

Referring to FIG. 4D, a first through-hole h1 is formed in the first glass layer 111. For example, the first through-hole h1 may be formed by penetrating through the first glass layer 111 between the first and second pattern grooves g1 and g2 using drilling or the like.

Figure 4E:
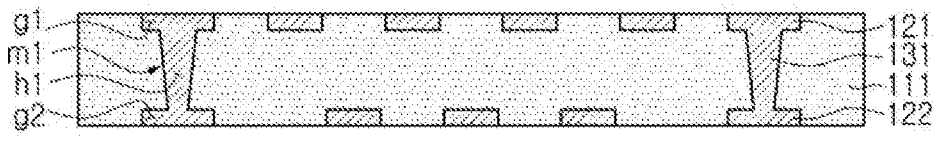

Referring to FIG. 4E, a first metal layer m1 is formed in the first glass layer 111. For example, the first metal layer m1 may be formed by filling the first and second pattern grooves g1 and g2 and the first through-hole h1 through a plating process. In the plating process, electroless plating, electrolytic plating, and the like may be sequentially performed. If necessary, other conductor plugging processes may be used. Thereby, the first and second wiring layers 121 and 122 and the first via layer 131 may be formed in the first glass layer 111.

The third and fourth pattern grooves g3 and g4, the second and third through-holes h2 and h3, and the second and third metal layers m2 and m3 may be formed in the second and third glass layers 112 and 113 through substantially the same process as the process described with reference to FIGS. 4A to 4E. Therefore, the third and fourth wiring layers 123 and 124 and the second and third via layers 132 and 133 may be formed in the second and third glass layers 112 and 113.

Figure 4F:
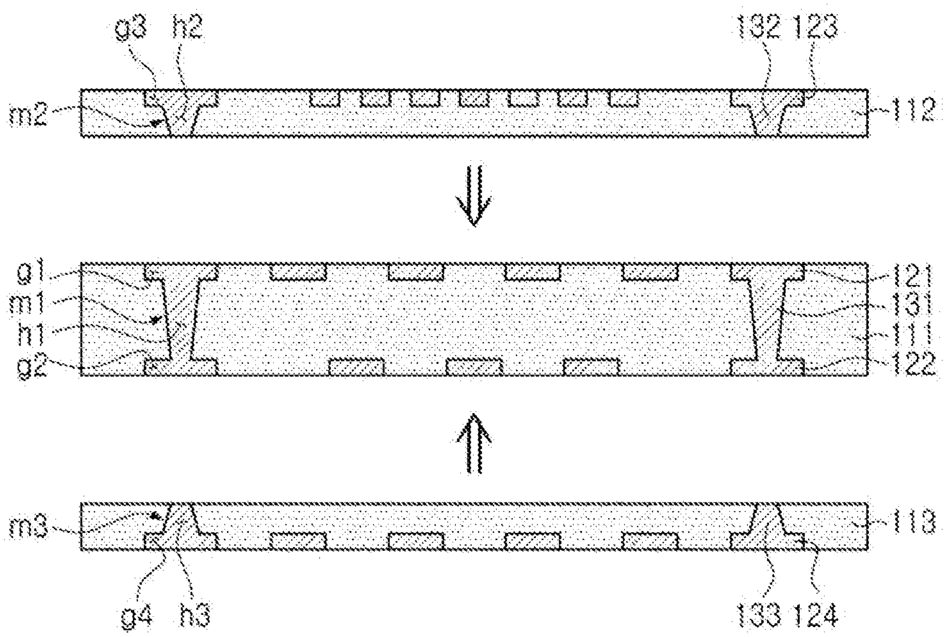
Figure 4G:
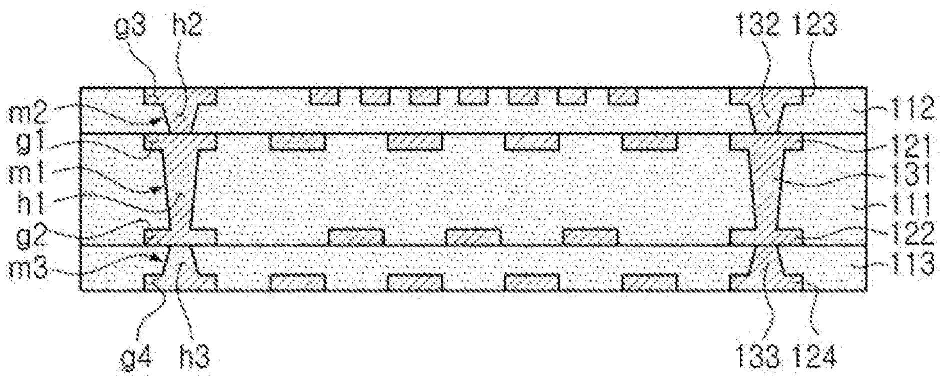

Referring to FIGS. 4F and 4G, the first to third glass layers 111, 112, and 113 are bonded vertically. For example, in the upper and lower portions of the first glass layer 111 in which the first metal layer m1 is formed, the second glass layer 112 in which the second metal layer m2 is formed and the third glass layer 113 in which the third metal layer m3 is formed, are disposed respectively, and then, the first to third metal layers m1, m2, and m3 and the first to third glass layers 111, 112, and 113 may be vertically bonded. For example, a copper (Cu)-silicon dioxide ($SiO_2$) hybrid bonding may be used. For example, silicon dioxide ($SiO_2$) of the respective first to third glass layers 111, 112, and 113 are bonded, and subsequently, copper (Cu) of the respective first to third metal layers m1, m2, and m3 may be bonded.

Figure 4H:
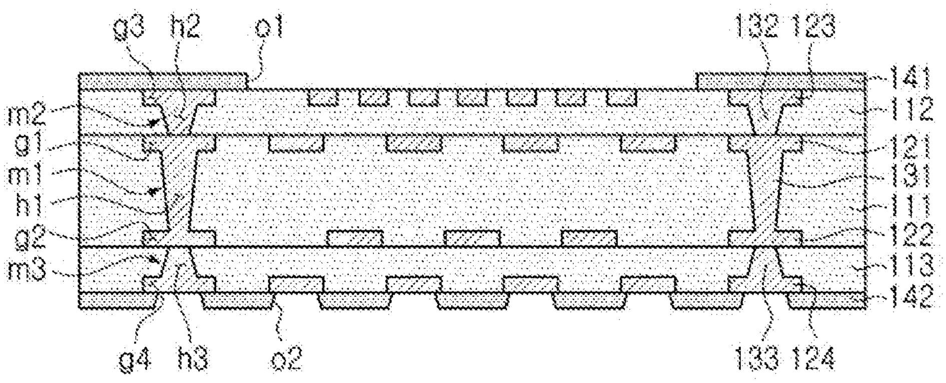

Referring to FIG. 4H, first and second resist layers 141 and 142 having first and second openings o1 and o2, respectively, are formed on the second and third glass layers 112 and 113. The first and second resist layers 141 and 142 may be formed by coating and drying a solder resist material, but are not limited thereto, and may also be formed by a method of laminating a solder resist layer that is in a film state. If necessary, the above-described semiconductor chip 151 may be mounted on the first resist layer 141, and the connecting member 152 and the underfill 153 may be used to mount the semiconductor chip 151. Through a series of processes, the circuit board 100A according to the above-described example may be manufactured.

In addition, other contents are substantially the same as those described in the circuit board 100A according to the above-described example, and redundant descriptions thereof will be omitted.

Figure 5:
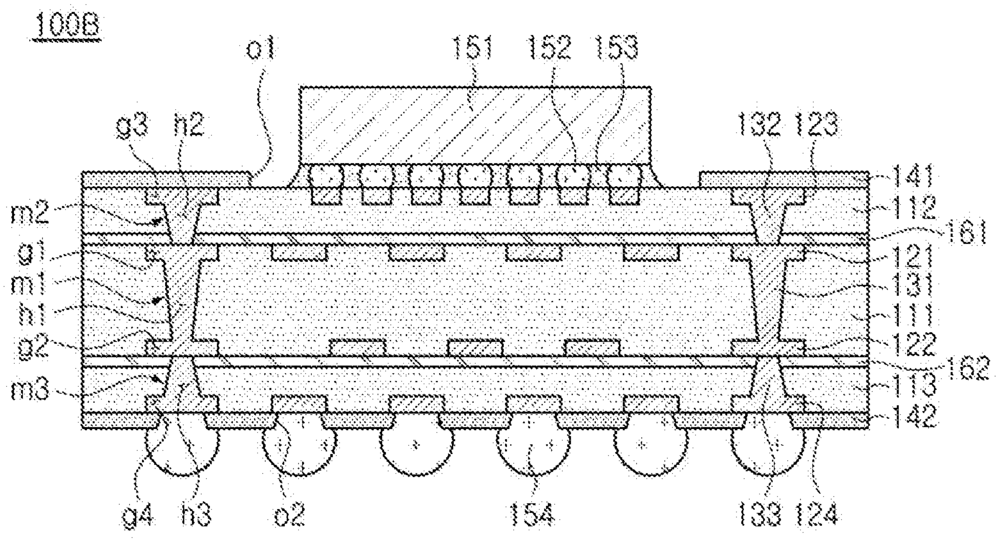
FIG. 5 is a schematic cross-sectional view of another example of a circuit board.

FIG. 5 is a cross-sectional view schematically illustrating another example of a circuit board.

Referring to the drawings, a circuit board 100B according to another example may further include a first adhesive layer 161 disposed between first and second glass layers 111 and 112 and/or a second adhesive layer 162 disposed between the first and third glass layers 111 and 113, with respect to the circuit board 100A according to the above-described example. The second through-hole h2, for example, the second via layer 132 may further penetrate the first adhesive layer 161, and the third through-hole h3, for example, the third via layer 133 may further penetrate the second adhesive layer 162. The first adhesive layer 161 may cover the exposed upper surface of the first wiring layer 121, and the second adhesive layer 162 may cover the exposed lower surface of the second wiring layer 122. As such, in another example, the first to third glass layers 111, 112 and 113 in which the first to fourth wiring layers 121, 122, 123, and 124 and the first to third via layers 131, 132, and 133 are formed may be bonded vertically through the first and second adhesive layers 161 and 162. The first and second adhesive layers 161 and 162 may include an adhesive film or the like including an acrylic resin or an epoxy resin, but the present disclosure is not limited thereto. The first and second adhesive layers 161 and 162 may include other bonding materials. The thickness of each of the first and second adhesive layers 161 and 162 is not particularly limited, but may be at least thinner than the thickness of each of the first to third glass layers 111, 112, and 113.

In addition, other contents are substantially the same as those described in the circuit board 100A according to the above-described example, and redundant description thereof will be omitted.

FIGS. 6A to 6I are process diagrams schematically illustrating an example of manufacturing the circuit board of FIG. 5.

FIGS. 6A to 6E are substantially the same as the processes described in FIGS. 4A to 4E. Therefore, first to fourth pattern grooves g1, g2, g3, and g4 may be formed in the first to third glass layers 111, 112, and 113. In addition, a first through-hole h1 and a first metal layer m1 may be further formed in the first glass layer 111. For example, the first and second wiring layers 121 and 122 and the first via layer 131 may be formed in the first glass layer 111.

Figure 6A:
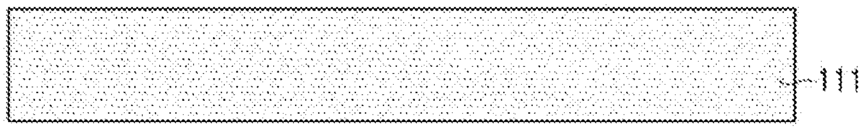
FIGS. 6A to 6I are process diagrams schematically illustrating an example of manufacturing the circuit board of FIG. 5.
Figure 6B:
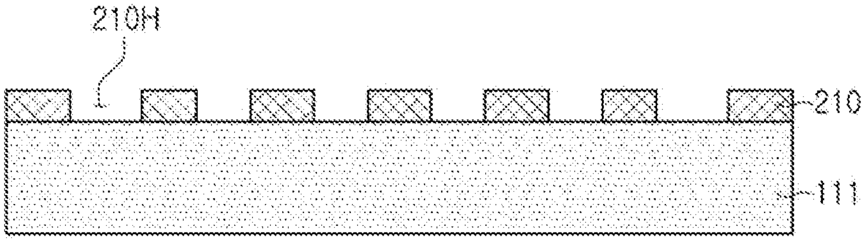
Figure 6C:
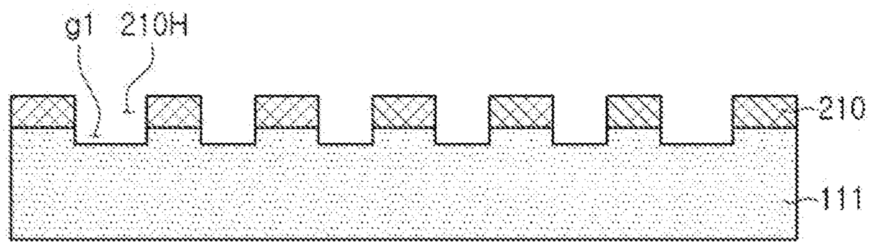
Figure 6D:
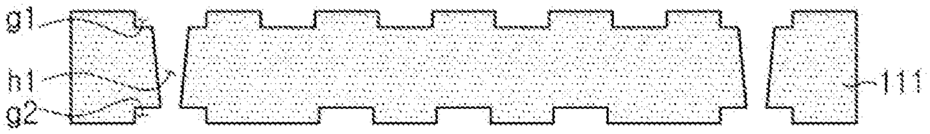
Figure 6E:
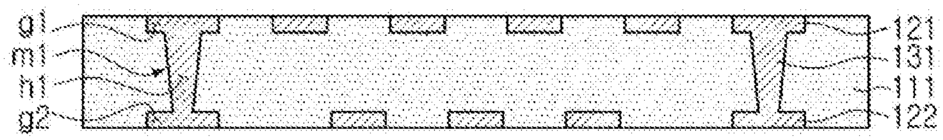
Figure 6F:
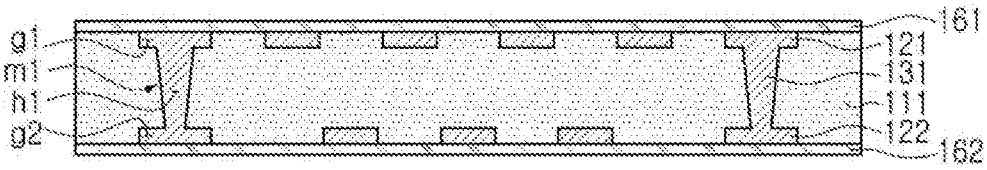

Referring to FIG. 6F, first and second adhesive layers 161 and 162 are attached to the upper and lower surfaces of the first glass layer 111, respectively. The first and second adhesive layers 161 and 162 may be respectively attached in the form of films, but are not limited thereto.

Figure 6G:
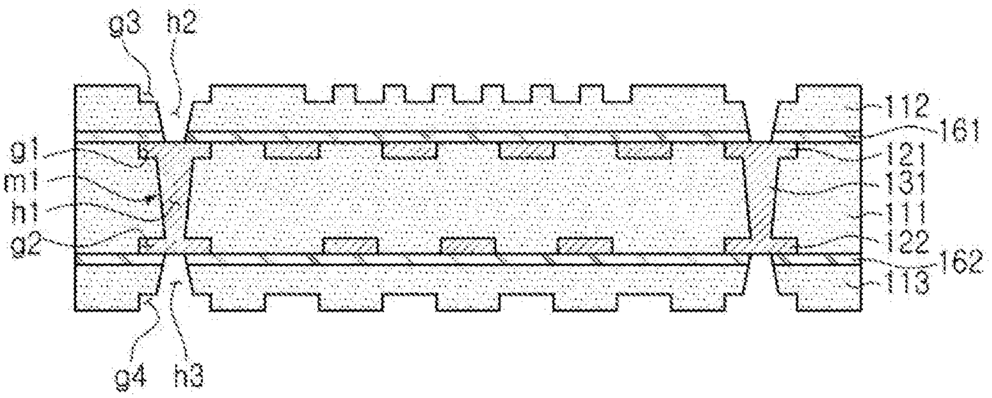

Referring to FIG. 6G, the second glass layer 112 having a third pattern groove g3 is attached to the upper surface of the first adhesive layer 161. In addition, the third glass layer 113 in which the fourth pattern groove g4 is formed is attached to the lower surface of the second adhesive layer 162. a second through-hole h2 Next, a penetrating through the second glass layer 112 and the first adhesive layer 161, and a third through-hole h3 penetrating through the third glass layer 113 and the second adhesive layer 162 are formed. For example, the second and third through-holes h2 and h3 may be formed by penetrating through the first adhesive layer 161 and the second glass layer 112 below the third pattern groove g3, and the third glass layer 113 and the second adhesive layer 162 above the fourth pattern groove g4, using drilling or the like.

Figure 6H:
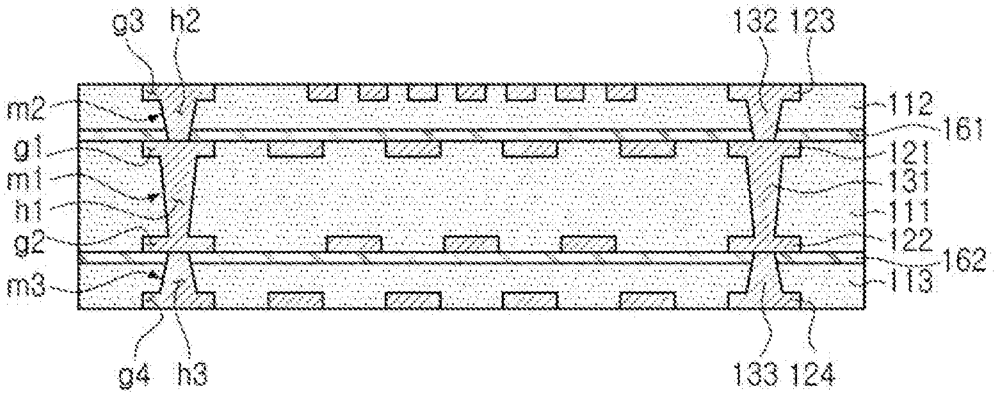

Referring to FIG. 6H, second and third metal layers m2 and m3 are formed in the second and third glass layers 112 and 113, respectively. For example, the second and third metal layers m2 and m3 may be formed by filling the third and fourth pattern grooves g3 and g4 and the second and third through-holes h2 and h3 through a plating process. In the plating process, electroless plating, electrolytic plating, and the like may be sequentially performed. If necessary, other conductor plugging processes may be used. Thereby, the third wiring layer 123 and the second via layer 132 may be formed in the second glass layer 112. In addition, the fourth wiring layer 124 and the third via layer 133 may be formed in the third glass layer 113.

Figure 6I:
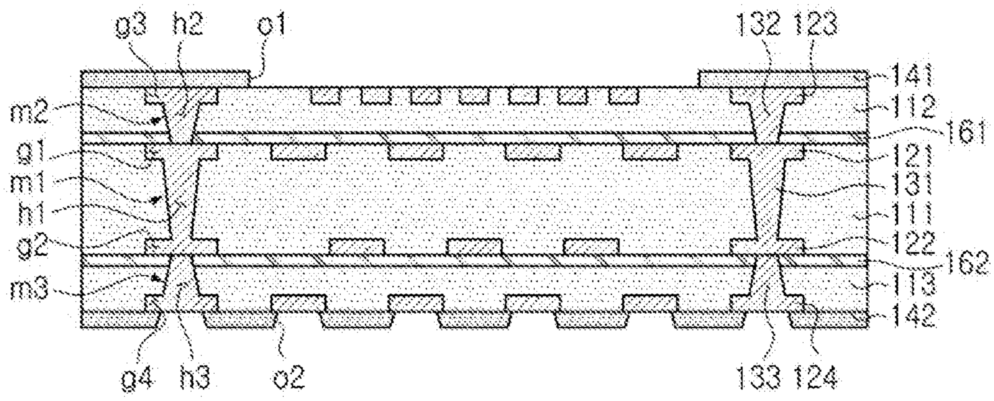

Referring to FIG. 6I, first and second resist layers 141 and 142 having first and second openings o1 and o2, respectively, are formed on the second and third glass layers 112 and 113. If necessary, the above-described semiconductor chip 151 may be mounted on the first resist layer 141, and the connecting member 152 and the underfill 153 may be used to mount the semiconductor chip 151. The circuit board 100B according to the example described above may be manufactured through a series of processes.

Other contents are substantially the same as those described for the circuit board 100A according to the above-described example, the circuit board 100B according to another example, and the method of manufacturing the circuit board 100A according to the above-described example, and thus redundant descriptions thereof will be omitted.

Figure 7:
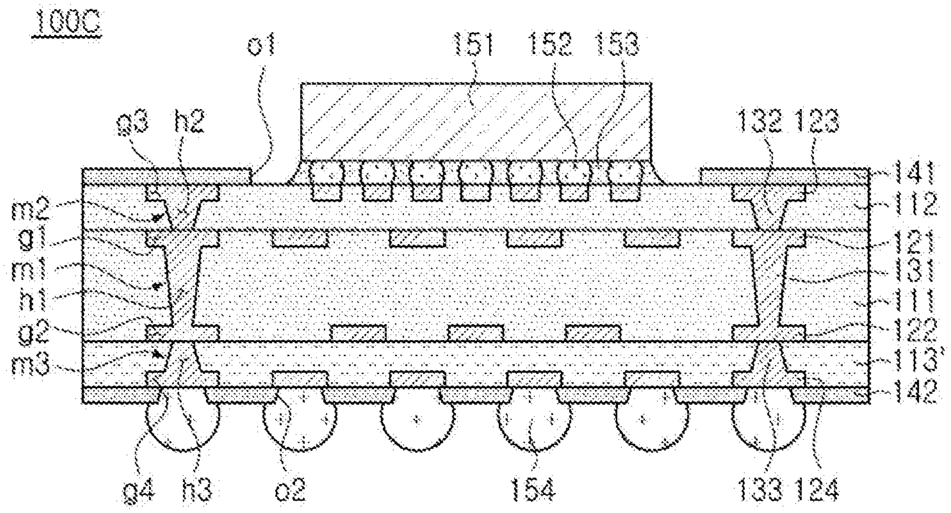
FIGS. 7 and 8 are cross-sectional views schematically illustrating modified examples of the circuit board of FIGS. 3 and 5, respectively.
Figure 8:
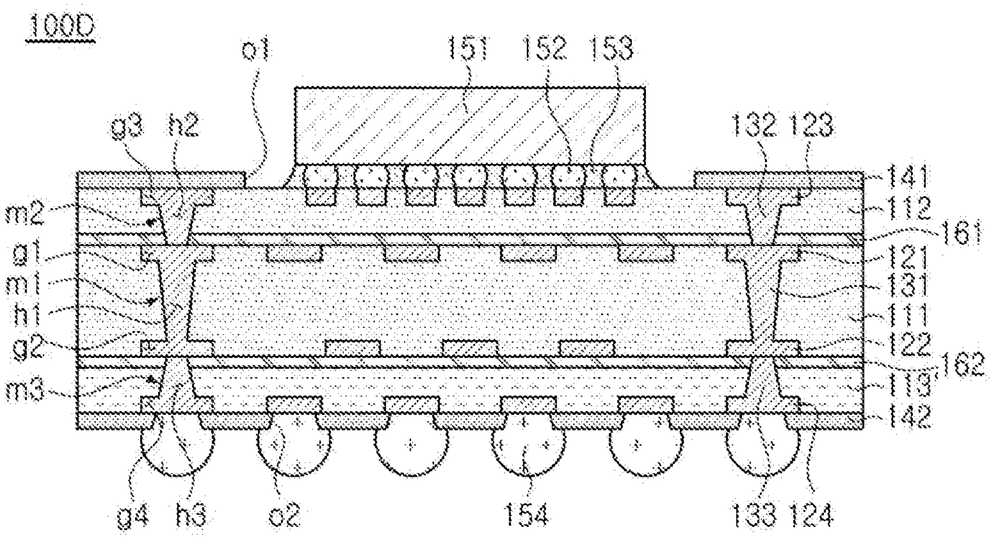

FIGS. 7 and 8 are cross-sectional views schematically illustrating modified examples of the circuit board of FIGS. 3 and 5, respectively.

Referring to the drawings, in circuit boards 100C and 100D according to modified examples, as compared with the circuit boards 100A and 100B according to the above-described example and another example, respectively, the third glass layer 113 that is a third insulating layer may be replaced with a third organic insulating layer 113'. For example, when the circuit boards 100C and 100D according to modified examples are applied as Ball Grid Array (BGA) substrates or the like, a fine pattern may be relatively, unnecessary on the bottom side, and accordingly, in this case, a general organic insulating layer, such as Ajinomoto Build-up Film (ABF) or Prepreg (PPG), may be applied as the build-up layer. For example, the third organic insulating layer 113' may include thermosetting resins such as epoxy resins, thermoplastics such as polyimide, or organic insulating materials containing inorganic filler, organic filler and/or glass fiber (Glass Fiber, Glass Cloth, Glass Fabric) together with resin. The fourth wiring layer 124 disposed in a lower portion of the third organic insulating layer 113' may be embedded in the lower portion of the third organic insulating layer 113', but the present disclosure is not limited thereto. If necessary, the fourth wiring layer 124 may be disposed to protrude on the lower surface of the third organic insulating layer 113'.

Other contents are substantially the same as those described in the circuit boards 100A and 100B according to the above-described example and the other example, and duplicate description thereof will be omitted. In addition, in the process of manufacturing the circuit boards 100A and 100B according to the above-described example and another example, in the case of combining a general build-up process, the circuit boards 100C and 100D according to the above-described modifications may be manufactured, and redundant description thereof will be omitted.

As set forth above, according to an embodiment, there may be provided a circuit board including a multilayer glass layer on which the wiring layer is formed, in which occurrence of a problem in adhesion of a wiring layer may be prevented even when a glass material is used.

In the present disclosure, the expression "covering" may include a case of covering at least a portion as well as a case of covering the whole, and may also include a case of directly covering as well as a case of indirectly covering. In addition, the expression of filling may include not only a case of completely filling but also a case of approximately filling, and may include, for example, a case where some air gaps or voids exist.

In the present disclosure, determinations may be provided by including process errors, positional deviations, errors in measurement, and the like, substantially occurring in the manufacturing process. For example, being substantially coplanar may include not only the case of being completely in the same plane, but also the case of being in approximately the same plane.

In the present disclosure, the same insulating material may mean not only the completely same insulating material, but also including the same type of insulating material. Therefore, the composition of the insulating material is substantially the same, but a detailed composition ratio thereof may be slightly different.

In the present disclosure, the meaning of cross-section may mean a cross-sectional shape when the object is vertically cut, or a cross-sectional shape when the object is viewed from a side-view. In addition, the meaning of a plane may mean a plane shape when the object is horizontally cut, or a plane shape when the object is viewed from a top-view or bottom-view.

In the present disclosure, lower, lower portion, lower surface, and the like are used to mean a downward direction based on the cross section of the drawing for convenience, and upper, upper portion, upper surface, and the like are used to mean the opposite direction. However, this is to define the direction for convenience of description, and the scope of the claims is not particularly limited by the description of this direction, of course, and the concept of upper and lower may change at any time.

In the present disclosure, the meaning of being connected is a concept including not only being directly connected but also being indirectly connected through an adhesive layer or the like. In addition, the meaning of being electrically connected concept including both is a physically connected and nonconnected cases. In addition, expressions such as first, second and the like are used to distinguish one component from another, and do not limit the order and/or importance of the components. In some cases, without departing from the scope of rights, the first element may be named a second element, and similarly, the second element may be referred to as the first element.

The expression "an (one) example" used in the present disclosure does not mean the same embodiments, and is provided to emphasize and describe different unique characteristics. However, the examples presented above are not excluded from being implemented in combination with features of other examples. For example, even if a matter described in a specific example is not described in another example, it may be understood as a description related to another example, unless there is a description contrary to or contradictory to the matter in the other example.

Terms used in this disclosure are only used to describe an example, and are not intended to limit the disclosure. In this case, singular expressions include plural expressions unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A circuit board comprising:

a first glass layer having a first pattern groove and a second pattern groove disposed in upper and lower surfaces of the first glass layer, respectively, and a first through-hole disposed between the first and second pattern grooves and connecting the first and second pattern grooves;

a first wiring layer and a second wiring layer disposed in or on upper and lower portions of the first glass layer, respectively, wherein the first wiring layer is disposed in the first pattern groove and the second wiring layer is disposed in the second pattern groove;

a first via layer disposed in the first through-hole and penetrating through the first glass layer and connected to the first and second wiring layers, the first via layer having a tapered cross section;

a second glass layer disposed on an upper surface of the first glass layer, and having a third pattern groove in an upper surface and a second through-hole disposed below the third pattern groove;

a third wiring layer disposed in or on an upper portion of the second glass layer, wherein the third wiring layer is disposed in the third pattern groove; and a second via layer disposed in the second through-hole and penetrating through the second glass layer and connected to the first and third wiring layers; and a first adhesive layer disposed between the first glass layer and the second glass layer, wherein the first and second glass layers respectively include plate glass, and wherein the second via layer further penetrates the first adhesive layer and directly contacts the first wiring layer.

2. The circuit board of claim 1, wherein the first glass layer is thicker than the second glass layer.

3. The circuit board of claim 1, wherein the upper surface and a lower surface of the first glass layer are substantially coplanar with an upper surface of the first wiring layer and a lower surface of the second wiring layer, respectively, and an upper surface of the second glass layer is substantially coplanar with an upper surface of the third wiring layer.

4. The circuit board of claim 1, wherein the first adhesive layer covers an exposed upper surface of the first wiring layer.

5. The circuit board of claim 1, further comprising:

a first resist layer disposed on an upper surface of the second glass layer and having a first opening exposing at least a portion of the third wiring layer; and a semiconductor chip disposed on the first opening of the first resist layer and connected to the exposed at least a portion of the third wiring layer through a connecting member.

6. The circuit board of claim 1, further comprising:

a third insulating layer disposed on a lower surface of the first glass layer;

a fourth wiring layer disposed in a lower portion of the third insulating layer; and a third via layer penetrating through the third insulating layer and connected to the second and fourth wiring layers.

7. The circuit board of claim 6, wherein the third insulating layer includes plate glass.

8. The circuit board of claim 6, wherein the third insulating layer includes an organic insulating layer.

9. The circuit board of claim 6, wherein the third insulating layer is in direct contact with the first glass layer, and the third via layer is in direct contact with the second wiring layer.

10. The circuit board of claim 6, further comprising a second adhesive layer disposed between the first glass layer and the third insulating layer, wherein the third via layer further penetrates the second adhesive layer, and the second adhesive layer covers an exposed lower surface of the second wiring layer.

11. The circuit board of claim 6, further comprising:

a second resist layer disposed on a lower surface of the third insulating layer and having a second opening exposing at least a portion of the fourth wiring layer; and an electrical connection metal disposed on the second opening of the second resist layer and connected to the exposed at least a portion of the fourth wiring layer.

12. A circuit board comprising:

a first glass layer having a first pattern groove and a second pattern groove disposed in upper and lower surfaces, respectively, and a first through-hole disposed between the first and second pattern grooves and connecting the first and second pattern grooves;

a first metal layer disposed in the first and second pattern grooves and the first through-hole;

a second glass layer disposed on an upper surface of the first glass layer, and having a third pattern groove in an upper surface and a second through-hole disposed below the third pattern groove; and a second metal layer disposed in the third pattern groove and the second through-hole; and a first adhesive layer disposed between the first glass layer and the second glass layer, wherein the second through-hole penetrates the second glass layer and the first adhesive layer and the second metal layer directly contacts the first metal layer, and wherein at least one of the first through-hole and the second through-hole has a tapered cross section.

13. A circuit board comprising:

a plurality of glass layers bonded to each other, each glass layer having a wiring layer embedded therein; adhesive layers disposed between at least some adjacent ones of the plurality of glass layers; and vias embedded in one or more of the plurality of glass layers and at least one of the adhesive layers to connect to respective wiring layers in the plurality of glass layers to each other, wherein at least one of the vias has a tapered cross section.

14. The circuit board of claim 13, wherein each of the plurality of glass layers includes plate glass.

15. The circuit board of claim 13, wherein each wiring layer is substantially coplanar with one surface of a corresponding one of the plurality of glass layers in which said each wiring layer is embedded therein.

* * * * *